(12) United States Patent
Koh

(10) Patent No.: US 6,921,940 B2
(45) Date of Patent: Jul. 26, 2005

(54) MOS TRANSISTOR AND FABRICATION METHOD THEREOF

(75) Inventor: Kwan-Ju Koh, Seoul (KR)

(73) Assignee: Dongbuanam Semiconductor Inc., Seoul (KR)

( * ) Notice: Subject to any disclaimer, the term of this patent is extended or adjusted under 35 U.S.C. 154(b) by 0 days.

(21) Appl. No.: 10/725,383

(22) Filed: Dec. 3, 2003

(65) Prior Publication Data

US 2004/0108546 A1 Jun. 10, 2004

(30) Foreign Application Priority Data

Dec. 5, 2002 (KR) ................................. 10-2002-0076823

(51) Int. Cl.[7] .............................................. H01L 29/76
(52) U.S. Cl. ................. 257/330; 257/333; 257/334; 257/331; 257/332; 257/329; 438/259; 438/412; 438/270; 438/272
(58) Field of Search ................................ 257/330, 333, 257/334, 331, 332, 329, 288; 438/259, 412, 270, 272

(56) References Cited

U.S. PATENT DOCUMENTS

| 6,252,277 | B1 | * | 6/2001 | Chan et al. ................. 257/330 |
| 6,365,468 | B1 | | 4/2002 | Yeh et al. |
| 6,399,986 | B2 | * | 6/2002 | Ha ............................... 257/331 |
| 6,475,865 | B1 | | 11/2002 | Yang et al. |
| 6,504,224 | B1 | | 1/2003 | Ahn et al. |
| 6,541,859 | B1 | | 4/2003 | Forbes et al. |
| 6,717,200 | B1 | * | 4/2004 | Schamberger et al. ...... 257/302 |
| 6,720,617 | B2 | * | 4/2004 | Einav .......................... 257/332 |
| 6,818,946 | B1 | * | 11/2004 | Venkatraman .............. 257/330 |

* cited by examiner

Primary Examiner—Nathan J. Flynn
Assistant Examiner—Remmon R. Fordé
(74) Attorney, Agent, or Firm—Pillsbury Winthrop Shaw Pittman LLP

(57) ABSTRACT

A MOS transistor suitable for microscopic applications and a fabrication method thereof are disclosed. The fabrication method includes forming a trench by selectively etching a semiconductor substrate; forming a channel region consisting of a silicon layer with a predetermined width in the bottom of the trench and forming a gate oxide film on the channel region; forming a SiGe film on the gate oxide film and within the trench and burying the trench; forming a gate groove with a predetermined width to expose the gate oxide film by selectively etching the SiGe film; and forming a gate electrode by forming a silicon layer on the exposed gate oxide film such that the gate groove is buried.

22 Claims, 2 Drawing Sheets

MOS TRANSISTOR AND FABRICATION METHOD THEREOF

CROSS-REFERENCE TO RELATED APPLICATIONS

This application relates to and claims priority to the Republic of Korea Patent Application No. 10-20020076823, filed on Dec. 5, 2002, the contents of which are incorporated herein by reference.

BACKGROUND OF THE INVENTION

1. Field of the Invention

The present invention relates to a semiconductor device, and more particularly the present invention relates to a MOS transistor and a method of fabricating the same.

2. Description of Related Art

In general, a conventional MOS transistor is a kind of field effect transistor ("FET"). The MOS transistor includes source and drain regions formed on a semiconductor substrate. A gate oxide film and a gate region are formed on the semiconductor substrate. In the MOS transistor, metal wires are connected to upper portions of the source region, the drain region and the gate region. The metal wires apply electrical signals to each of the source region, drain region, and gate region, to thereby operate the MOS transistor. These regions function as electrodes.

Techniques related to this are disclosed in U.S. Pat. Nos. 6,541,859, 6,504,224, 6,475,865, and 6,365,468.

FIG. 1 is a sectional view of a conventional MOS transistor. A silicon wafer 1 functions as a semiconductor substrate. A gate oxide film 2 having a predetermined width is formed on the wafer 1. A polysilicon layer 3 to be used as a gate electrode is formed on the gate oxide film 2 and a surface of active region of the silicon wafer 1. A P or N-typed dopant of light concentration is then injected into the silicon wafer 1 at the active region using the polysilicon layer 3 as a mask to form a lightly doped drain ("LDD") 4 on the silicon wafer 1 at the active region, as shown in FIG. 1. Much of the polysilicon layer 3 is removed leaving the gate electrode 3 on top of the gate oxide film 2. Side walls 5 are then formed adjacent the gate electrode 3, as shown in FIG. 1. Next, after side walls 5 are formed on both sides of the polysilicon layer 3 source and drain electrodes are formed under the lightly doped drain 4, as shown in FIG. 1. The electrodes are formed by injecting dopant having a heavy concentration, which has the same conductivity as the LDD 4, into the silicon wafer 1 at the active region. The source and drain electrodes 6 are formed on the silicon wafer 1 at the active region.

This conventional MOS transistor has drawbacks. There are structural limits associated with miniaturizing these transistors. As such, these transistors are not well suited for the current downsizing or miniaturizing trend associated with the high integration of the semiconductor devices.

Therefore, there is a need for a MOS transistor having a new structure that is suitable for use in today's small, highly integrated semiconductor devices. There is also a need for a fabrication method thereof.

BRIEF SUMMARY OF THE INVENTION

In consideration of the above problem, it is an aspect of the present invention to provide a MOS transistor that is capable of being miniaturized or reduced in size and a fabrication method thereof.

A miniaturized MOS transistor in accordance with the present invention can be achieved by forming a trench by etching a predetermined region of a semiconductor substrate, burying a p+ polycrystalline SiGe film in the trench, and using the SiGe film as an active region, which corresponds to the desired size of the MOS transistor. The present invention is suitable for forming MOS transistors of varying sizes. The fabrication technique disclosed herein produces flexibility in manufacturing transistors of reduced size.

According to an aspect of the present invention, a method of fabricating a MOS transistor is disclosed. The method of fabricating includes forming a trench in a semiconductor substrate by selectively etching the semiconductor substrate. A channel region is formed with a predetermined width in the bottom of the trench. The channel region can be formed from a silicon layer. A gate oxide film is formed on the channel region. The silicon layer forming the channel region can be formed having a thickness of 1000–3000 Å. During formation, the silicon layer is formed on the top surface of the semiconductor substrate and in the trench. The gate oxide film can be formed having a thickness of 100–500 Å on the silicon layer. The channel region, preferably has predetermined width, and the gate oxide film are sized to the desired dimensions by forming a pattern of photosensitive film covering a predetermined width of the gate oxide film within the trench on the gate oxide film and etching the exposed gate oxide film and the silicon layer using the pattern of photosensitive film as a mask.

A source and drain film is formed on the gate oxide film and within the trench. The source and drain film buries the trench. Preferably, the source and drain film can be a SiGe film. Preferably, when the SiGe film is formed, impurities are doped at the same time of depositing the SiGe such that a polycrystalline SiGe doped with the impurities is formed. In addition, the SiGe film can be deposited to have a ratio of Si to Ge in a range of 9:1 to 7:3. A thermal process can be performed on the SiGe film after the SiGe film is deposited.

A gate groove having a predetermined width is formed by selectively etching the source and drain film to expose at least a portion of the gate oxide film. Side walls are formed on opposing sides of the gate groove. The side walls can be formed of nitride films.

A gate electrode is formed by forming a silicon layer on the exposed gate oxide film such that the gate groove is buried.

In accordance with the present invention after forming the SiGe film on an overall top surface of the semiconductor substrate including the interior of the trench, remaining SiGe film except for the interior of the trench is removed. A tetra ethyl ortho silicate ("TEOS") film is then deposited on the overall top surface of the semiconductor substrate including the SiGe film. The TEOS film is then planarized by means of etch-back processing or chemical mechanical polishing until the semiconductor substrate is exposed.

BRIEF DESCRIPTION OF THE DRAWINGS

The invention will be described in conjunction with the following drawings in which like reference numerals designate like elements and wherein.

DETAILED DESCRIPTION OF A PREFERRED EMBODIMENT

A preferred embodiment of the present invention will now be described in detail with reference to FIGS. 2A–2E.

Figure 1:
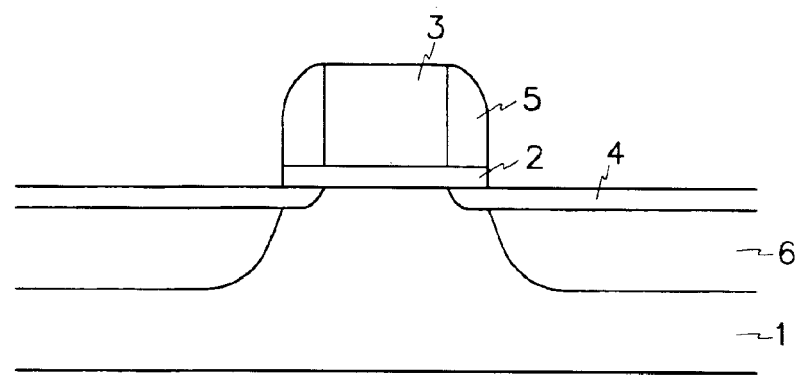
FIG. 1 is a sectional view of a conventional MOS transistor.
Figure 2A:
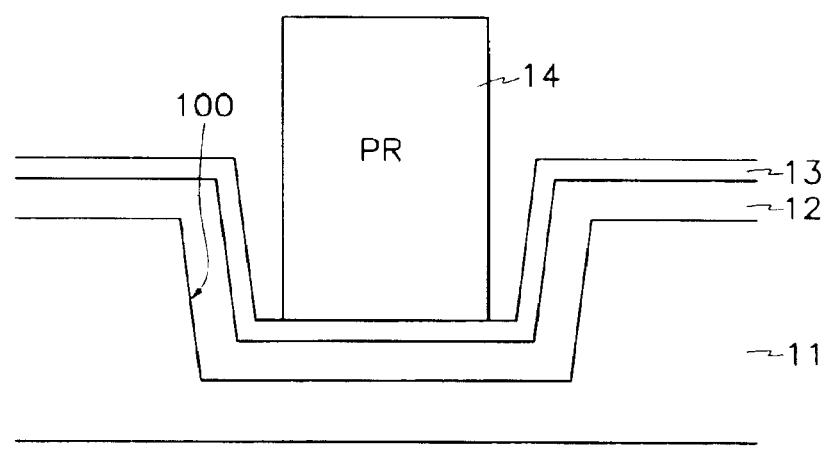
FIGS. 2A to 2E are sectional views illustrating a method of fabricating a MOS transistor according to the present invention.
Figure 2B:
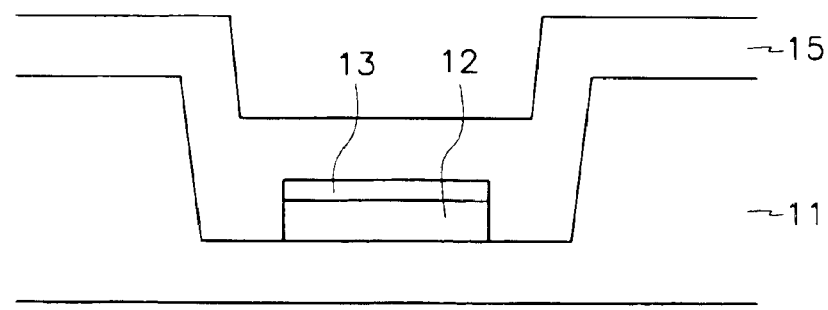
Figure 2C:
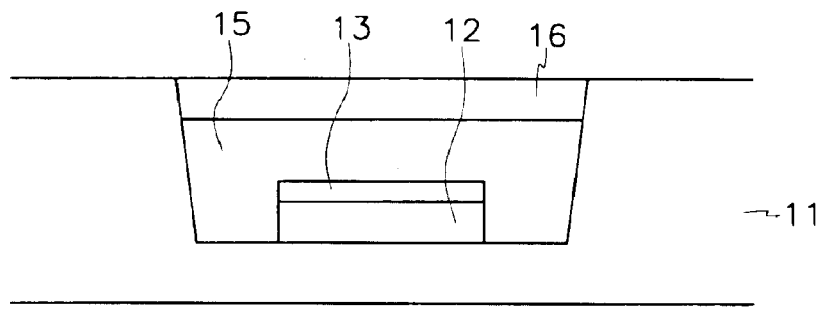
Figure 2D:
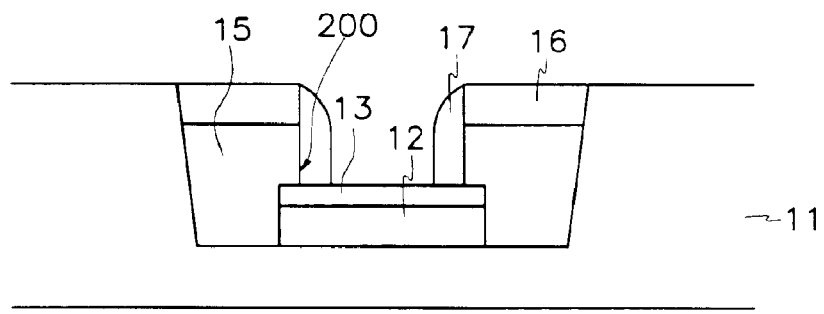
Figure 2E:
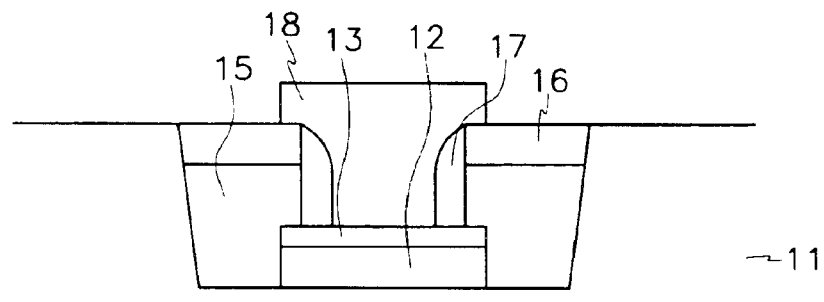

FIG. 2E illustrates a sectional view of a MOS transistor according to the present invention. The MOS transistor includes a semiconductor substrate 11. The semiconductor substrate 11 can be a silicon wafer or other suitable substrate material. The substrate 11 includes a trench 100, shown in FIG. 2A, with a predetermined width of active region. A channel region 12 is located on the substrate 11 in the trench 100. The channel region 12 can be formed from silicon with a predetermined width and a predetermined thickness.

A gate oxide film 13 is located on the channel region 12. A gate groove 200, shown in FIG. 2C is located above the gate oxide film 13.

A SiGe film 15, which functions as a source/drain film, is located on opposing sides of the trench 100. The SiGe film 15 can be made from a polycrystalline material doped with impurities. The material has a ratio of Si to Ge that lies in a range of 9:1 to 7:3. An insulation film 16 is located on top of the SiGe film 15. The film 16 can be made of a TEOS (tetra ethyl ortho silicate) material. A gate groove 200, shown in FIG. 2D, is bounded by the oxide film 13 on the bottom and nitride films 15 and 16 on the sides. A nitride film is provided to form side walls 17 on opposing sides of the gate groove 200. The side walls 17 can extend from the oxide film 13 to the top of the groove 200, as shown in FIG. 2D. A gate electrode 18 fills the remaining portion of the groove 200. The gate electrode 18 extends over the upper portion of the side walls 17 onto the insulation film 16. The gate electrode 18 can be formed from a polycrystalline silicon layer.

A method of fabricating the MOS transistor in accordance with the present invention will be described in connection with FIGS. 2A to 2E.

A trench 100 is formed in the semiconductor substrate 11 by selectively etching a predetermined region of the substrate 11. Since the trench 100 corresponds to an active region on which a semiconductor device is formed, the trench 100 is formed with a size corresponding to a width of the desired active region. After the formation of the trench 100, a silicon film 12 is formed on the top surface of the silicon wafer 11 and the trench 100, as shown in FIG. 2A The film 12 will function as a channel region, as shown in FIG. 2E, into which a current can flow. The silicon film 12 can be formed with a thickness of 1000–3000 Å. An oxide film 13 is formed on the silicon film 12. The oxide film 13 functions as a gate oxide film. The gate oxide film 13 can be formed at a thickness of 100–500 Å.

A photosensitive film 14 is then applied on the oxide film 13. The film 14 is exposed and developed so that a pattern with a predetermined width is formed in the interior of the trench 100, as shown in FIG. 2A.

The exposed oxide film 13 and silicon film 12 are then etched. The pattern of photosensitive film 14 functions as a mask so that the oxide film 13 and the silicon film 12 under the film 14 remain with a predetermined width in the interior of the trench 100.

Subsequently, a p+ polycrystalline SiGe film 15 that is heavily doped with p-typed impurities is formed on the top surface of the silicon wafer 11 over the silicon film 12 and the oxide film 13 and in the interior of the trench 100, as shown in FIG. 2B. The SiGe film 15 functions as a source and drain film or region. When the SiGe film 15 is formed, the polycrystalline SiGe can be deposited while supplying Si source material and Ge source material simultaneously such that a ratio of Si to Ge lies in a range of 9:1 to 7:3. The range is preferably 8:2. Impurity doping for an adjustment of a driving voltage is carried out at the same time the SiGe film is formed. After the deposition of the SiGe film 15, a thermal process is performed so that the impurities, Si and Ge are diffused and the quality of film is stabilized.

The SiGe film 15 is selectively removed such that the film 15 remains only in the interior of the trench 100, as shown in FIG. 2C. An insulation film 16 is then deposited on the top surface of the silicon wafer 11 including the SiGe film 15. The insulation film 16 can be a tetra ethyl ortho silicate film. A top surface of the insulation film 16 is planarized by means of etch-back processing or chemical mechanical polishing until the silicon wafer 11 is exposed, as shown in FIG. 2C. The film 16 only remains in the trench 100.

A gate groove 200 having a predetermined width is then formed by selectively etching the insulation film 16 and the SiGe film 15. The oxide film 13 is thereby exposed to a predetermined width through the gate groove 200.

A nitride film is then deposited on the oxide film 13, to fill the gate groove 200. The nitride film is then etched to form side walls 17.

A polycrystalline silicon layer is then formed on the exposed oxide film 13 and the side walls 17 such that the gate groove 200 is sufficiently buried. A gate electrode 18 is then formed by etching polycrystalline silicon layer to a desired thickness and width, as shown in FIG. 2E.

Since a trench to be used as an active region is formed by etching a predetermined region of a semiconductor substrate and a p+ polycrystalline SiGe film to be used as a source/drain region is buried in the trench, the size of the active region can be freely adjusted. Accordingly, a miniaturized MOS transistor that is very well suited to the trend of high integration of the semiconductor device can be easily fabricated. Particularly, the method of fabrication in accordance with the present invention very well suited in the formation of microscopic elements that cannot be fabricated by conventional techniques.

Although a preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A MOS transistor comprising:
    a semiconductor substrate having a trench formed therein, wherein the trench has a predetermined width forming an active region;
    a channel region made from silicon, wherein the channel region has a predetermined width and a predetermined thickness on a bottom of the trench;
    a gate oxide film is located on the channel region;
    a source and drain region buried in the interior of the trench;
    a gate groove having a predetermined width is located on the gate oxide film in the interior of the trench; and
    a gate electrode buried in the gate groove.

2. The MOS transistor of claim 1, wherein the source and drain region includes a polycrystalline material doped with impurities.

3. The MOS transistor of claim 1, wherein the source and drain region includes a SiGe film.

4. The MOS transistor of claim 3, wherein the SiGe film has a ratio of Si to Ge in a range of 9:1 to 7:3.

5. The MOS transistor of claim 4, wherein the SiGe film is a polycrystalline material doped with impurities.

6. The MOS transistor of claim 1, wherein the channel region has a thickness of 1000–3000 Å.

7. The MOS transistor of claim 1, further comprising:
an insulation film is located on a top surface of the source and drain region; and
side walls made from a nitride film located on sides of the gate groove.

8. The MOS transistor of claim 7, wherein the insulation film is a tetra ethyl ortho silicate film.

9. A method of fabricating a MOS transistor, comprising:
forming a trench by selectively etching a semiconductor substrate;
forming a channel region having a silicon layer with a predetermined width in a bottom of the trench;
forming a gate oxide film on the channel region;
forming a source and drain film on the gate oxide film and within the trench, wherein the source and drain film buries the trench;
forming a gate groove with a predetermined width to expose at least a portion of the gate oxide film by selectively etching the source and drain film; and
forming a gate electrode by forming a silicon layer on the exposed gate oxide film such that the gate groove is buried.

10. The method of claim 9, after the silicon layer is formed on an overall top surface of the semiconductor substrate including the trench and the gate oxide film is formed on the silicon layer, the channel region and the gate oxide film are sized to a predetermined width, by forming a pattern of a photosensitive film covering the predetermined width of the gate oxide film within the trench on the gate oxide film and etching the exposed gate oxide film and the silicon layer using the pattern of the photosensitive film as a mask.

11. The method of claim 9, wherein the silicon layer has a thickness between 1000–3000 Å.

12. The method of claim 9, wherein the gate oxide film has a thickness between 100-500 Å.

13. The method of claim 9, wherein the source and drain film is formed from a SiGe film.

14. The method of claim 13, wherein the SiGe film is formed by depositing a polycrystalline SiGe film doped with the impurities.

15. The method of claim 14, when the SiGe film is formed, impurities are doped at the same time of depositing the SiGe film.

16. The method of claim 14, wherein the SiGe film is deposited to have a ratio of Si to Ge in a range of 9:1 to 7:3.

17. The method of claim 13, further comprising:
performing a thermal process on the SiGe film after the SiGe film is deposited.

18. The method of claim 9, wherein the source and drain film is formed by depositing the source and drain film on an overall top surface of the semiconductor substrate including the interior of the trench, and subsequently removing a portion of the source and drain film such that the source and drain film remains only in the interior of the trench.

19. The method of claim 18, further comprising:
forming a tetra ethyl ortho silicate film on the overall top surface of the semiconductor substrate including the source and drain film; and
planarizing the tetra ethyl ortho silicate film until the semiconductor substrate is exposed.

20. The method of claim 19, wherein the planarization of the tetra ethyl ortho silicate film is performed by one of an etch-back processing and a chemical mechanical polishing.

21. The method of claim 19, further comprising:
forming side walls on both sides of the gate groove.

22. The method of claim 21, wherein the side walls are formed form a nitride film.

* * * * *